(12) United States Patent
Demharter et al.

(10) Patent No.: US 8,269,493 B2
(45) Date of Patent: Sep. 18, 2012

(54) ARRANGEMENT TO TRANSMIT DIGITAL SIGNALS IN A MAGNETIC RESONANCE APPARATUS

(75) Inventors: Nikolaus Demharter, Dormitz (DE); Georg Pirkl, Dormitz (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 971 days.

(21) Appl. No.: 12/275,695

(22) Filed: Nov. 21, 2008

(65) Prior Publication Data

US 2009/0137898 A1 May 28, 2009

(30) Foreign Application Priority Data

Nov. 22, 2007 (DE) .......................... 10 2007 056 222

(51) Int. Cl.
*G01V 3/00* (2006.01)

(52) U.S. Cl. ........................................ 324/309; 324/307

(58) Field of Classification Search .......... 324/300–322; 600/407–445
See application file for complete search history.

(56) References Cited

U.S. PATENT DOCUMENTS

| | | | |
|---|---|---|---|
| 5,160,891 A | 11/1992 | Keren | |
| 5,384,536 A | 1/1995 | Murakami et al. | |
| 6,339,717 B1 | 1/2002 | Baumgartl et al. | |
| 7,514,924 B2 * | 4/2009 | Luedeke et al. | 324/309 |
| 7,602,182 B2 * | 10/2009 | Heid et al. | 324/307 |
| 7,944,383 B2 * | 5/2011 | Doris | 341/139 |
| 2008/0197849 A1 | 8/2008 | Heid et al. | |
| 2008/0204027 A1 | 8/2008 | Luedeke et al. | |
| 2011/0249616 A1 * | 10/2011 | Duval et al. | 370/316 |
| 2011/0254732 A1 * | 10/2011 | Martin et al. | 342/357.59 |

* cited by examiner

*Primary Examiner* — Brij Shrivastav
(74) *Attorney, Agent, or Firm* — Schiff Hardin LLP

(57) ABSTRACT

An arrangement for transmission of digital signals in a magnetic resonance apparatus has a local coil that has reception antenna connected via an amplifier with an A/D converter so that a magnetic resonance signal received via the individual antenna is amplified as an analog signal and is converted into a digital signal. The A/D converter is connected at the output with a transmission device that is designed for capacitive coupling transmission of the digital signal.

13 Claims, 6 Drawing Sheets

ARRANGEMENT TO TRANSMIT DIGITAL SIGNALS IN A MAGNETIC RESONANCE APPARATUS

BACKGROUND OF THE INVENTION

1. Field of the Invention

The present invention concerns an arrangement to transmit digital signals in a magnetic resonance apparatus.

2. Description of the Prior Art

Measurement signals are acquired in magnetic resonance apparatuses with the aid of local coils. Each measurement signal is amplified and transmitted to an A/D converter via a respective cable. Thereafter, each digitized signal is transmitted via an optical wave guide to an image processing unit that forms a magnetic resonance image from a number of transmitted digital signals.

An analog/digital converter that is directly arranged in a coil plug, and therefore at the local coil housing is known, from DE 19911988 A1. The signal transmission from the local coil module to the stationary image processing unit again ensues via an optical wave guide.

The coil plug is moved with the patient table during the MR examination, such that the optical wave guide must exhibit a relatively large loop in order to prevent separation from the stationary image processing unit during the table movement.

Moreover, the respective optical wave guides are used with a number of different local coils in different MR examinations, such that they are subject to wear due to repeated plugging and unplugging procedures. Bending that also leads to increased wear occurs at the optical wave guide due to the movements of the patient table.

SUMMARY OF THE INVENTION

An object of the present invention is to provide an improved arrangement for transmission of digital signals in an MR apparatus that is less prone to wear.

In the arrangement according to the invention for transmission of digital signals in a magnetic resonance, a reception antenna of a local coil is connected via an amplifier with an A/D converter so that a magnetic resonance signal received via the individual antenna is amplified as an analog signal and is converted into a digital signal.

In a first embodiment, the A/D converter is connected at the output with an electro-optical transducer that forms an optical signal from the digital signal of the A/D converter. The electro-optical transducer is connected at the output with an optical transmission device that is designed for wireless free space transmission of the optical signal (OSS1).

In a second embodiment, the A/D converter is connected at the output with a transmission device that is designed for capacitive coupling transmission of the digital signal.

For example, the optical transmission device is designed as a laser diode while the optical reception device is designed as a receiver lens.

For example, the optical transmission device is arranged at a local coil housing so that it is within optical range of the corresponding optical reception device.

For example, the capacitive transmission could ensue via two at least partially overlapping capacitor plates or, respectively, capacitor surfaces that possess an air gap relative to one another.

In an embodiment, the optical signal transmission occurring wirelessly is designed to be bidirectional. It is therefore possible to measure a received light power at the receiver. This is transferred back to the optical transmission device at least as information and is used to control the transmission power at the transmitter.

It is therefore possible to suitably compensate for respective transmission conditions (for example length of the transmission path, contamination of the optical reception device, component properties, . . . ), and therefore to optimize the optical transmission.

In a preferred development, each local coil is equipped with an optical transmission device while a lower number of optical reception devices are arranged at the receiver. In MR examinations, that local coil that is located in the magnetic center of the MR apparatus due to the table movement typically always delivers a usable signal. This is simultaneously the examination region of the MR apparatus.

Given corresponding arrangement of the optical reception device in the magnetic center, it is therefore possible to automatically select the evaluable signal via the table movement. A crossbar distributor that has previously been used for signal selection according to the prior art can therefore be advantageously omitted.

The selection of a respective local coil that is actively receiving signals ensues solely due to the movement of the patient table or, respectively, the movement of the local coils arranged on the patient.

In another embodiment, multiple receiver lenses are arranged in the magnetic center of the MR apparatus as optical reception devices. If one local coil after another now passes by the receiver lenses, only the strongest local coil signal is processed further.

For example, the selection of the signal ensues using optical power measurement devices that are associated with each receiver lens and that determine the most powerful local coil signal.

In a preferred development, the digital local coil signals are merged into a serial data stream with the aid of a multiplexer device, electro-optically transduced and then transmitted. By the use of the multiplexer it is possible to rapidly transmit multiple digitized signals serially via the air gap.

To reduce interference, it is possible to use a data scrambling method, a forward error correction method and/or a method for CRC checking before and/or after the merging.

The wireless transmission can ensue with the aid of spread-spectrum transmission methods (CDMA).

The arrangement according to the invention is free of wear and can be realized cost-effectively.

DESCRIPTION OF THE PREFERRED EMBODIMENTS

Figure 1:
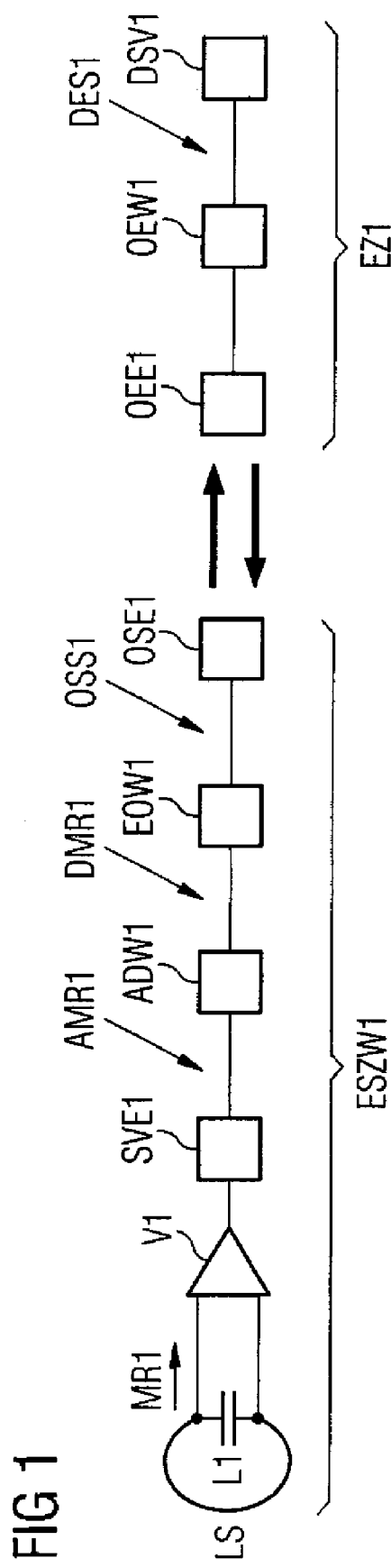
FIG. 1 shows an embodiment of an arrangement according to the invention for optical transmission of digital signals in a magnetic resonance apparatus.

FIG. 1 shows the arrangement according to the invention for optical transmission of digital signals in a magnetic resonance apparatus.

A local coil LS here contains a first reception antenna L1 designed as a coil, with which a magnetic resonance signal MR1 is received in a magnetic resonance examination.

The reception antenna L1 is connected at the output via an amplifier V1 with a signal processing device SVE1, such that the analog magnetic resonance signal MR1 is amplified and arrives at the signal processing device SVE1.

For example, the signal processing device SVE1 contains a filter and/or a device for signal conversion in an intermediate frequency range, or similar devices for analog signal processing.

The signal processing device SVE1 is connected at the output via an analog/digital converter ADW1 with an electro-optical transducer EOW1, such that a digital signal DMR1 that is transformed into an optical signal OSS1 is formed by the A/D converter ADW1 from the analog magnetic resonance signal AMR1 supplied to it.

The optical signal OSS1 arrives at an optical transmission device OSE1 that is designed for a wireless or, respectively, free space data transmission. For example, here a laser diode is used as a transmission device OSE1.

After a wireless transmission has occurred, the optical signal OSS1 is received by an optical reception device OEE1 and supplied to an optoelectrical transducer OEW1, which forms a digital reception signal DES1 from this again.

From the optoelectrical transducer OEW1, the digital reception signal DES1 arrives at a digital signal processing device DSV1 that converts the supplied signal into a magnetic resonance image.

The components L1, V1, SVE1, ADW1, EOW1 and OSE1 form a first reception-transmission branch ESZW1 in terms of functionality.

Figure 2:
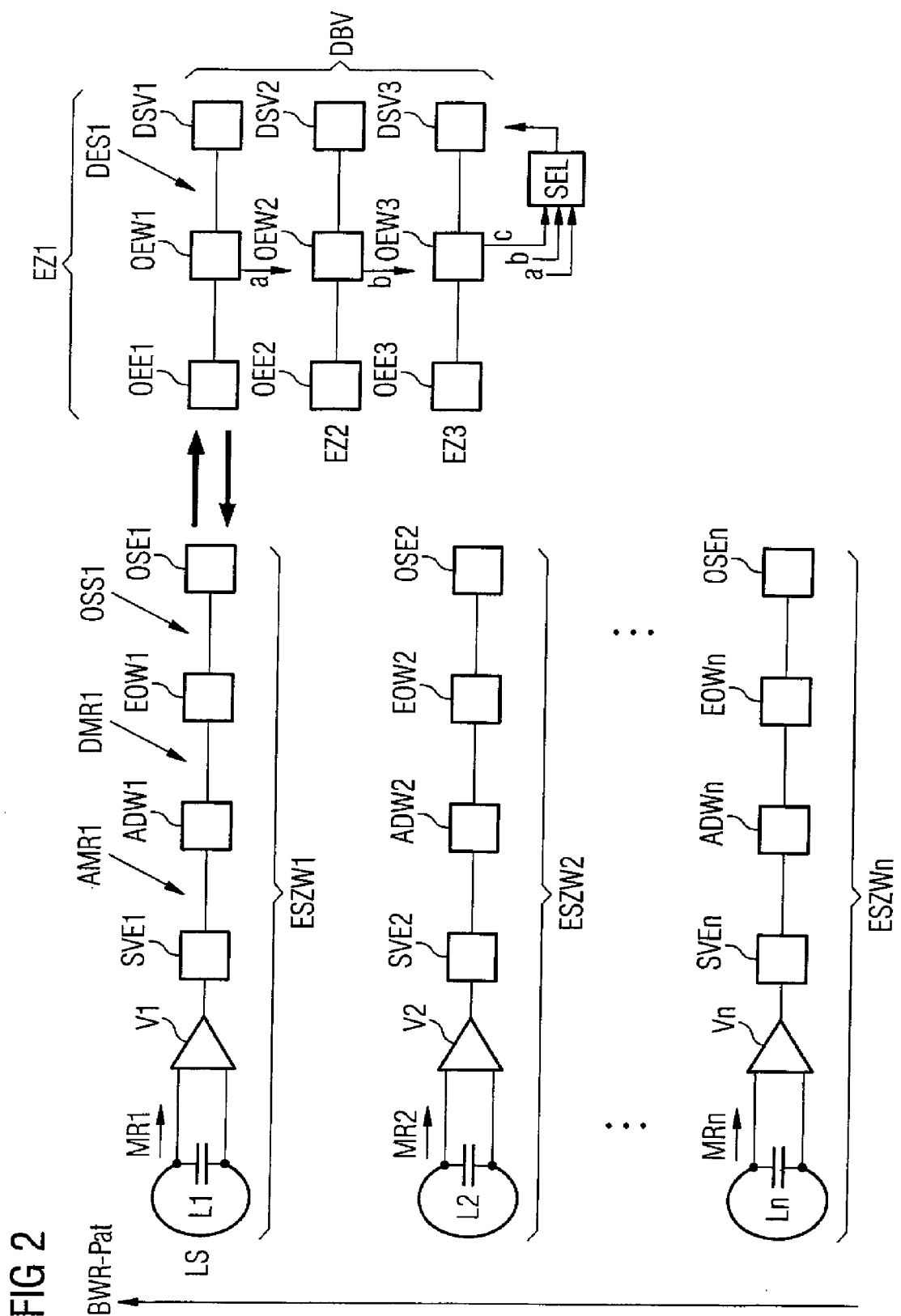
FIG. 2 shows a further embodiment of the arrangement according to the invention with reference to FIG. 1.

FIG. 2 shows an advantageous first development of the arrangement according to the invention with reference to FIG. 1.

Here a local coil LS is used that in total possesses n reception antennas L1 through Ln designed as coils.

An associable magnetic resonance signal MR1 through MRn is respectively received via each of the n reception antennas L1 through Ln.

n parallel reception-transmission branches ESZW1 through ESZWn that are identically constructed are formed via the use of n reception antennas L1 through Ln.

In a first reception-transmission branch ESZW1, the reception antenna L1 is connected at the output via an amplifier V1 with a signal processing device SVE1, such that the analog magnetic resonance signal MR1 is amplified and arrives at the signal processing device SVE1.

For example, the signal processing device SVE1 contains a filter and/or a device for signal conversion in an intermediate frequency range, or similar devices for analog signal processing.

The signal processing device SVE1 is connected at the output via an analog/digital converter ADW1 with an electro-optical transducer EOW1, such that a digital signal DMR1 that is transformed into an optical signal OSS1 is formed by the A/D converter ADW1 from the analog magnetic resonance signal AMR1 supplied to it.

The additional reception-transmission branches ESZW2 through ESZWn are designed identical to the first.

The optical signal OSS1 of the first reception-transmission branch ESZW1 arrives at an optical transmission device OSE1 that is designed for a wireless or, respectively, free space data transmission. After a wireless transmission has occurred, the optical signal OSS1 is received by an optical reception device OEE1 and processed further as described in FIG. 1.

The individual antennas L1 through Ln are serially attached to a patient to be examined, wherein the individual antennas are moved serially, one after another in a movement direction BWR-Pat during the MR examination.

That individual antenna that is located in the center of an examination region (here the individual antenna L1) transmits the optical signal OSS1 associated with it.

Due to the patient movement, optical signals of the reception-transmission branch ESZW2, . . . , ESZWn are subsequently transmitted serially and optically, one after another, such that an automatic selection of the respective active reception-transmission branch is implemented dependent on the patient movement.

To increase the reception certainty, multiple—here three—reception branches EZ1 through EZ3 are used at the optical reception side, which reception branches respectively possess an optical reception device OEE1 through OEE3, an opto-electrical transducer OEW1 through OEW3 and a digital signal processing device DSV1 through DSV3 (comparable to FIG. 1).

The optoelectrical transducers OEW1 through OEW3 are additionally used to measure the optical received power, designated a, b and c.

The received signal with the greatest received power is selected with the aid of a selector SEL before or after the respective digital signal processing device DSV1 through DSV3 and supplied to a device for digital image processing DBV.

In another variant, the received signals are supplied to a common device for digital image processing DBV, wherein there the respective strongest received signal is prioritized for digital image processing based on the patient movement.

Figure 3:
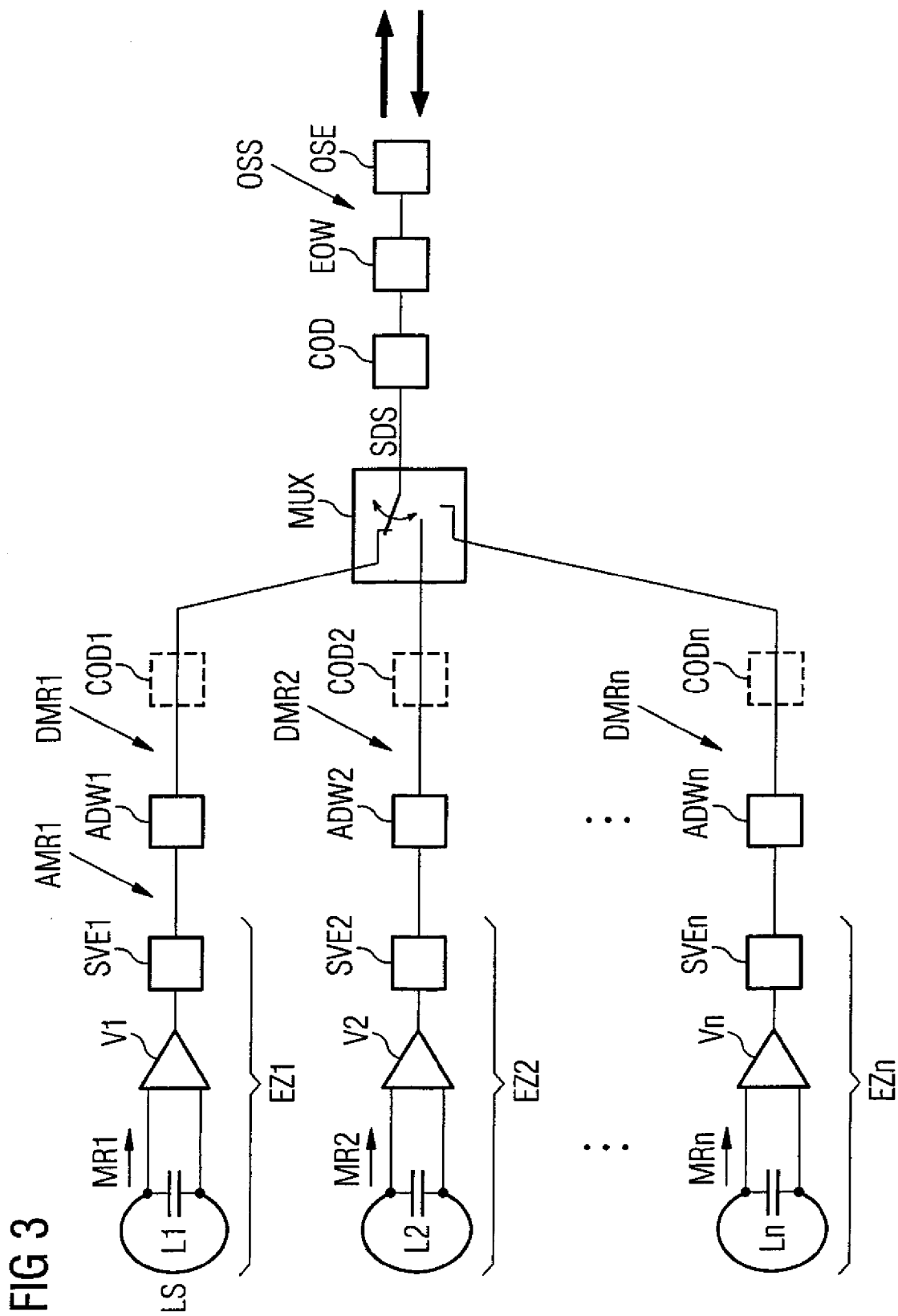
FIG. 3 shows a further embodiment of the arrangement according to the invention with reference to FIG. 1 and FIG. 2.

FIG. 3 shows an embodiment of the arrangement according to the invention with reference to FIG. 1 and FIG. 2.

In this embodiment, n reception branches EZ1 through EZn are used. As described in FIG. 1 and FIG. 2, each branch EZ1 through EZn has an individual antenna L1 through Ln that are advantageously arranged in the transverse direction relative to the patient movement. The n reception branches also have respective amplifiers V1 through Vn, respective signal processing devices SVE1 through SVEn, and respective A/D converters ADW1 through ADWn.

The n A/D converters ADW1 through ADWn are connected at the output with a multiplexer MUX that combines [merges] the digitized signals DMR1 through DMRn of the n reception branches EZ1 through EZn into a serial data stream SDS.

The serial data stream SDS is transduced into an optical signal OSS with the aid of an electro-optical transducer EOQ and is transmitted with the aid of an optical transmission device OSE.

It is possible to encode the individual digitized signals DMR1 through DMRn with the aid of encoders COD1 through CODn before the multiplexer MUX, and/or to conduct the encoding with the aid of an encoder COD after the multiplexer MUX and before the optical transducer.

In an advantageous development, the optical transmission ensues using CDMA or OFDM transmission techniques.

Figure 4:
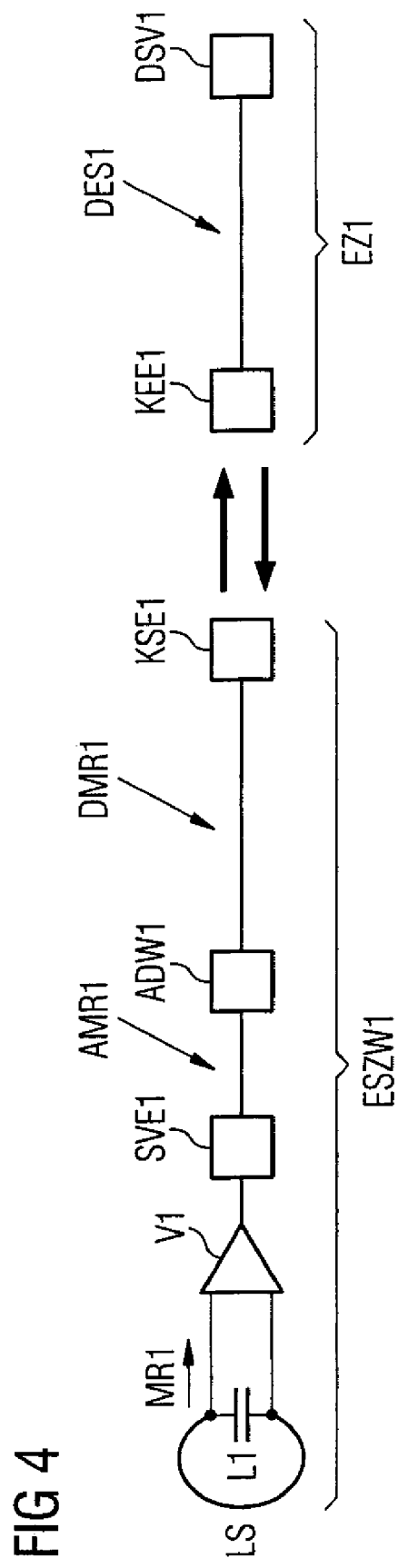
FIG. 4 shows an embodiment of the arrangement according to the invention for capacitive transmission of digital signals in a magnetic resonance apparatus.

FIG. 4 shows the arrangement according to the invention for capacitive transmission of digital signals in a magnetic resonance apparatus.

Here a local coil LS contains a first reception antenna L1 designed as a coil, via which a magnetic resonance signal MR1 is received in a magnetic resonance examination.

The reception antenna L1 is connected at the output via an amplifier V1 with a signal processing device SVE1, such that the analog magnetic resonance signal MR1 is amplified and arrives at the signal processing device SVE1.

For example, the signal processing device SVE1 contains a filter and/or a device for signal conversion in an intermediate frequency range, or similar devices for analog signal processing.

The signal processing device SVE1 is connected at the output via an analog/digital converter ADW1 with a transmission device KSE1 that is designed for a wireless data transmission via capacitive coupling.

The A/D converter ADW1 forms a digital signal DMR1 from the analog magnetic resonance signal AMR1 supplied to it, which digital signal DMR1 is supplied to the transmission device KSE1 for capacitive transmission.

After a wireless transmission has occurred, the capacitively transmitted signal DMR1 is received by a reception device KEE1 that is designed for a capacitive transmission and forms a digital reception signal DES1 again from the received signal.

The digital reception signal DES1 then arrives at a digital signal processing device DSV1 that converts the supplied signal into a magnetic resonance image.

The components L1, V1, SVE1, ADW1 and KSE1 form a first reception-transmission branch ESZW1 in terms of functionality.

Figure 5:
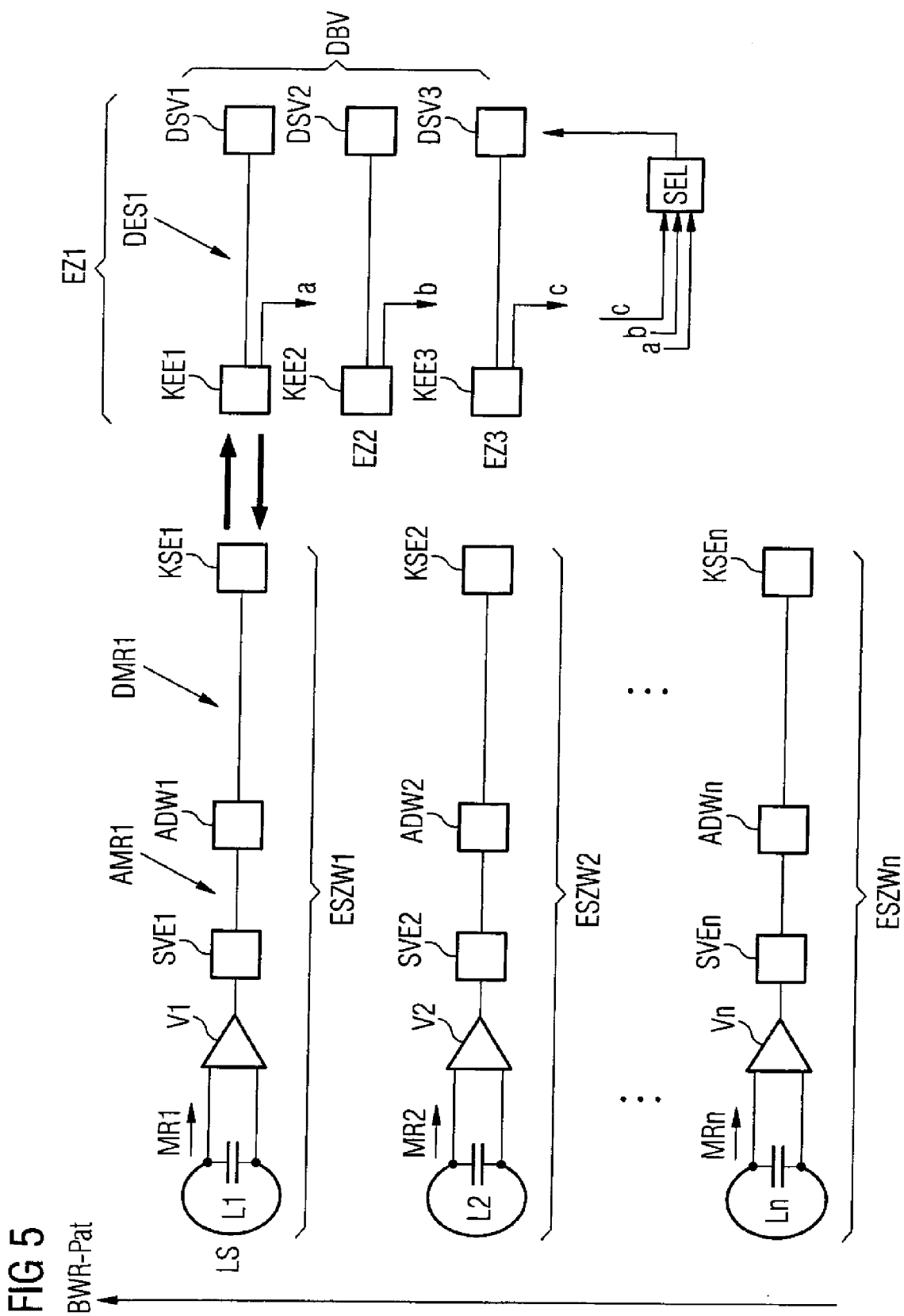
FIG. 5 shows a further embodiment of the arrangement according to the invention with reference to FIG. 4.

FIG. 5 shows an advantageous first development of the arrangement according to the invention with reference to FIG. 4.

Here a local coil LS is used that in total possesses n reception antennas L1 through Ln designed as coils.

An associable magnetic resonance signal MR1 through MRn is respectively received via each of the n reception antennas L1 through Ln.

n parallel reception-transmission branches ESZW1 through ESZWn that are identically constructed are formed via the use of n reception antennas L1 through Ln.

A first reception-transmission branch ESZW1 is designed as described in FIG. 4. The additional reception-transmission branches ESZW2 through ESZNn are designed identical to the first reception-transmission branch ESZW1.

The capacitive transmission of the signal as well as its further processing ensues as described in FIG. 4.

The individual antennas L1 through Ln are serially attached to a patient to be examined, wherein the individual antennas are moved serially, one after another in a movement direction BWR-Pat during the MR examination.

That individual antenna that is located in the center of an examination region (here the individual antenna L1) transmits the signal DMR1 associated with it.

Due to the patient movement, further signals of the reception-transmission branch ESZW2, . . . , ESZWn are subsequently transmitted serially, one after another, such that an automatic selection of the respective active reception-transmission branch is implemented via the patient movement.

To increase the reception certainty, multiple—here three—reception branches EZ1 through EZ3 are used at the reception side, which reception branches respectively possess a reception device KEE1 through KEE3 and a digital signal processing device DSV1 through DSV3 (comparable to FIG. 4).

The reception devices KEE1 through KEE3 are additionally used to measure the received power, designated a, b and c.

The received signal with the greatest received power is selected with the aid of a selector SEL before or after the respective digital signal processing device DSV1 through DSV3 and supplied to a device for digital image processing DBV.

In another variant, the received signals are supplied to a common device for digital image processing DBV, wherein there the respective strongest received signal is prioritized for digital image processing based on the patient movement.

Figure 6:
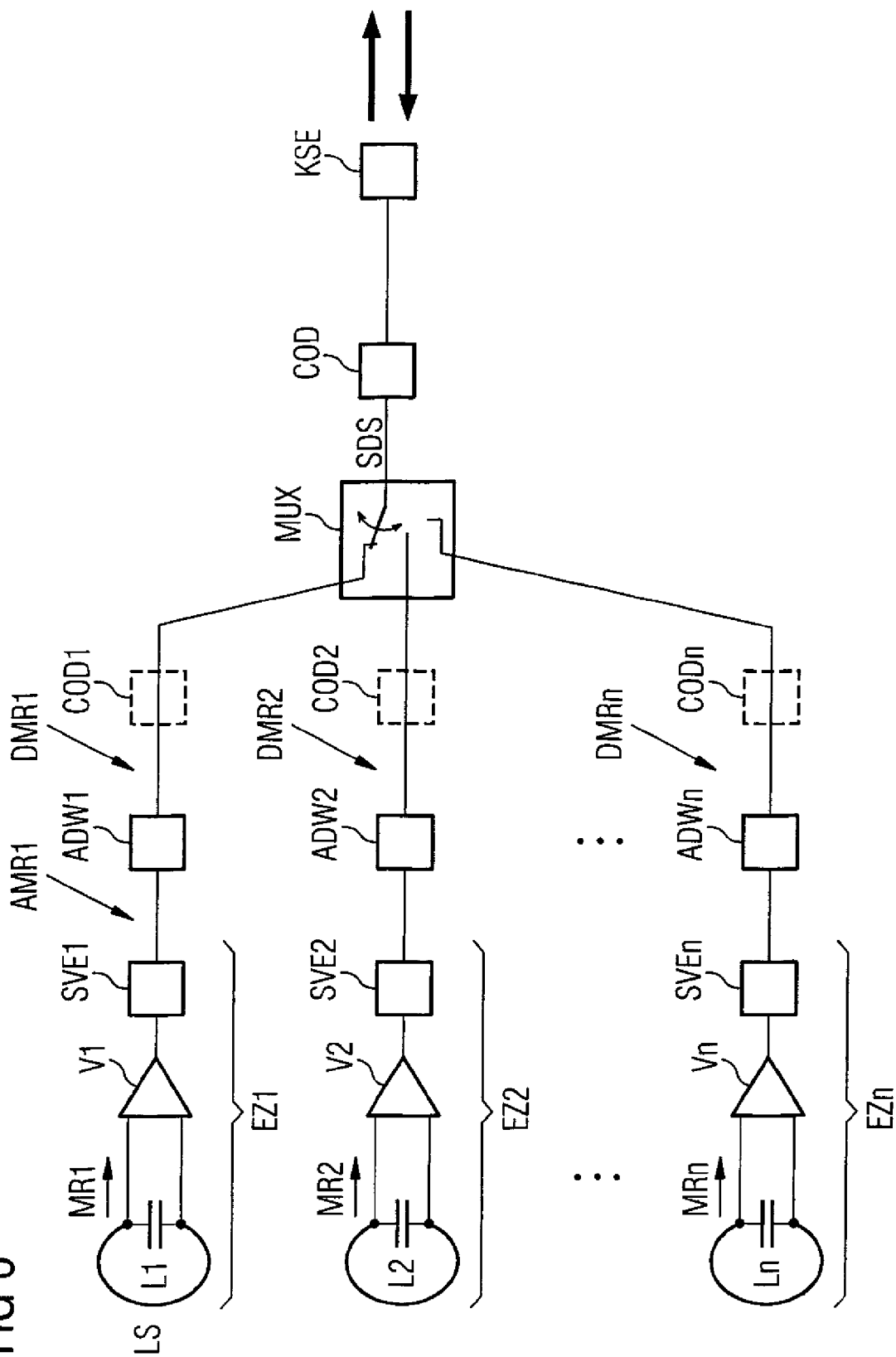
FIG. 6 shows a further embodiment of the arrangement according to the invention with reference to FIG. 4 and FIG. 5.

FIG. 6 shows an advantageous development of the arrangement according to the invention with reference to FIG. 4 and FIG. 5.

In this embodiment as well, n reception branches EZ1 through EZn are used. As described in FIG. 4 and FIG. 5. Each branch EZ1 through EZn has an individual antenna L1 through Ln that are advantageously arranged in the transverse direction relative to the patient movement. The n reception branches have respective amplifiers V1 through Vn, respective signal processing devices SVE1 through SVEn, and respective A/D converters ADW1 through ADWn.

The n A/D converters ADW1 through ADWn are connected at the output with a multiplexer MUX that combines [merges] the digitized signals DMR1 through DMRn of the n reception branches EZ1 through EZn into a serial data stream SDS.

The serial data stream SDS is transmitted with the aid of the transmission device KSE described in FIG. 4.

It is possible to encode the individual digitized signals DMR1 through DMRn with the aid of encoders COD1 through CODn before the multiplexer MUX, and/or to conduct the encoding with the aid of an encoder COD after the multiplexer MUX and before the optical transducer.

The optical transmission can ensue using CDMA or OFDM transmission techniques.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for transmission of digital signals in a magnetic resonance apparatus, comprising:
   a local coil comprising a reception antenna that receives magnetic resonance signals, an amplifier connected to the reception antenna that amplifies the received magnetic resonance signals, and an analog-to-digital converter connected to the amplifier that converts an amplified analog signal from the amplifier into a digital signal emitted at an output of the analog-to-digital converter;
   a transmission device connected to the output of the analog-to-digital converter that transmits said digital signal into free space by capacitive coupling transmission;
   a reception device capacitively coupled with said transmission device that receives, via free space, said digital signal from said transmission device; and
   a transducer connected to said reception device that forms a digital reception signal from the capacitively transmitted signal received by said reception device.

2. An arrangement as claimed in claim 1 wherein said reception device and said transducer are combined in a reception branch.

3. An arrangement as claimed in claim 2 wherein said transducer emits an output signal dependent on a measurement of power exhibited by the capacitively transmitted signal received by the reception device.

4. An arrangement as claimed in claim 2 wherein said reception antenna, said amplifier, said analog-to-digital converter and said transmission device are combined into a transmission branch.

5. An arrangement as claimed in claim 4 wherein said transmission branch is a first transmission branch and wherein said reception branch is a first reception branch, and comprising a plurality of transmission branches identical to said first transmission branch and a plurality of reception branches identical to said first reception branch, and wherein respective transmission branches capacitively transmit respective signals to respective reception branches.

6. An arrangement as claimed in claim 5 wherein each reception branch has a selector connected to the transducer therein, said selector selecting a capacitively transmitted signal for further processing dependent on said power.

7. An arrangement as claimed in claim 5 wherein the respective reception antennas of the plurality of transmission branches are successively attached in a series on a patient in whom said magnetic resonance signals originate, with the respective reception antennas successively passing an examination region of the patient due to movement of the patient in a movement direction, and wherein a respective transmission branch is selected to capacitively transmit the respective magnetic resonance signal received thereby to one of said reception branches.

8. An arrangement as claimed in claim 7 wherein multiple reception branches are arranged in succession to receive the capacitively transmitted signals.

9. An arrangement as claimed in claim 1 comprising a signal processor that processes the amplified analog signal before conversion to said digital signal by said analog-to-digital converter.

10. An arrangement for transmission of digital signals in a magnetic resonance apparatus, comprising:
    a local coil comprising a reception antenna that receives magnetic resonance signals, an amplifier connected to the reception antenna that amplifies the received magnetic resonance signals, and an analog-to-digital converter connected to the amplifier that converts an amplified analog signal from the amplifier into a digital signal emitted at an output of the analog-to-digital converter;
    a transmission device connected to the output of the analog-to-digital converter that transmits said digital signal into free space by capacitive coupling transmission];
    said reception antenna, said amplifier, said analog-to-digital converter and said transmission device forming a first transmission branch;
    a plurality of transmission branches identical to said first transmission branch; and
    multiplexer that forms a serial data stream from the respective digital signals from the respective transmission branches.

11. An arrangement as claimed in claim 10 wherein said multiplexer has a multiplexer output connected to said transmission device.

12. An arrangement as claimed in claim 10 comprising an encoder connected between said analog-to-digital converter and said multiplexer.

13. An arrangement as claimed in claim 10 comprising an encoder connected between said multiplexer and said transmission device.

* * * * *